(12) United States Patent
Park et al.

(10) Patent No.: US 8,426,257 B2
(45) Date of Patent: Apr. 23, 2013

(54) METHOD FOR FABRICATING SEMICONDUCTOR DEVICE

(75) Inventors: Hyun-Sik Park, Kyoungki-do (KR); Hae-Jung Lee, Kyoungki-do (KR); Jae-Kyun Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 414 days.

(21) Appl. No.: 12/004,179

(22) Filed: Dec. 20, 2007

(65) Prior Publication Data

US 2008/0220543 A1  Sep. 11, 2008

(30) Foreign Application Priority Data

Mar. 5, 2007  (KR) .................. 10-2007-0021453

(51) Int. Cl.
*H01L 27/10*  (2006.01)

(52) U.S. Cl.
USPC ........... 438/128; 438/598; 438/131; 438/467; 257/E21.215; 257/E21.216; 257/E21.592

(58) Field of Classification Search .................. 438/598, 438/131, 467, 132; 257/50, 208, 209, E21.215, 257/E21.216
See application file for complete search history.

(56) References Cited

U.S. PATENT DOCUMENTS

| | | | | |
|---|---|---|---|---|
| 6,174,803 B1 * | 1/2001 | Harvey | ......................... | 438/638 |
| 2002/0005551 A1 * | 1/2002 | Ema et al. | ..................... | 257/355 |
| 2003/0045034 A1 * | 3/2003 | Davis et al. | ................... | 438/128 |
| 2005/0026334 A1 * | 2/2005 | Knall | ............................. | 438/128 |
| 2005/0130351 A1 * | 6/2005 | Leedy | ........................... | 438/128 |
| 2006/0057783 A1 * | 3/2006 | Yun et al. | ...................... | 438/128 |
| 2006/0214260 A1 * | 9/2006 | Cho et al. | ...................... | 257/529 |

FOREIGN PATENT DOCUMENTS

| | | | |
|---|---|---|---|
| JP | 2005-012078 | * | 1/2005 |
| JP | 2005-12078 | | 1/2005 |
| KR | 2002-0017311 | | 3/2002 |
| KR | 10-2000-0050534 | * | 7/2002 |
| KR | 10-2004-0050141 | * | 1/2006 |
| KR | 10-2006-0001113 | | 1/2006 |
| KR | 10-2006-01342440 | | 12/2006 |

* cited by examiner

*Primary Examiner* — Julio J Maldonado
*Assistant Examiner* — Mohammad Choudhry
(74) *Attorney, Agent, or Firm* — Blakely, Sokoloff, Taylor & Zafman

(57) ABSTRACT

A method for fabricating a semiconductor device includes forming a fuse over a substrate, the fuse having a barrier layer, a metal layer, and an anti-reflective layer stacked, selectively removing the anti-reflective layer, forming an insulation layer over a whole surface of the resultant structure including the fuse, and performing repair-etching such that part of the insulation layer remains above the fuse.

7 Claims, 4 Drawing Sheets

CELL REGION   FUSE REGION

CELL REGION   FUSE REGION

METHOD FOR FABRICATING SEMICONDUCTOR DEVICE

CROSS-REFERENCE TO RELATED APPLICATIONS

The present invention claims priority of Korean patent application number 2007-0021453, filed on Mar. 5, 2007, which is incorporated by reference in its entirety.

BACKGROUND OF THE INVENTION

The present invention relates to a method for fabricating a semiconductor device and, more particularly, to a method of forming a fuse for a semiconductor device.

When a failure occurs in a semiconductor device, a fuse is used to repair such a failed part. In other words, in the case in which such a fail is neither a hard fail nor a severe fail after a semiconductor fabrication process is completed, a fuse line, that is a redundancy line, is cut off using a laser. Thereby, the operation of the semiconductor device is made possible.

Up to now, the fuse is not separately formed by an additional process, but is formed by using a conductive layer made up of a bit line, a word line, or the plate line (upper electrode) of a capacitor.

FIG. 1 is a cross-sectional view of a semiconductor device using an upper electrode as a fuse.

Referring to FIG. 1, a substrate 10 has a cell region and a fuse region. The cell region of substrate 10 is formed therein with cylindrical capacitors 14. Here, each cylindrical capacitor 14 is formed in the structure in which a lower electrode 11, a dielectric layer 12, and an upper electrode 13 are stacked. Particularly, the upper electrode 13 of the cylinder capacitor 14 is used as a fuse in the fuse region.

An insulation layer 15 is formed over the whole surface of the resultant structure, which includes the cylindrical capacitors 14. The insulation layer 15 of the fuse region is selectively etched, that is, is subjected to repair-etching until the insulation layer 15 remains over the upper electrode 13 used as the fuse at a predetermined thickness.

As described above, the typical method has used the upper electrode 13 as the fuse in the fuse region.

However, in the cylindrical capacitor 14 of the typical method, the upper electrode 13 is located slightly above the bit line without a great height difference, so that the insulation layer 15, which is formed over the fuse, becomes too thick. More specifically, the height of the upper electrode 13 used as the fuse in the fuse region is reduced by D1, compared to that of the upper electrode 13 that is originally formed over the uppermost layer of the capacitor, so that the insulation layer 15 has a thickness corresponding to the height difference.

For this reason, during the repair-etching, it takes excessive time to perform the repair-etching, and it is difficult to control the insulation layer 15 having a predetermined thickness so as to be formed over the fuse at a uniform thickness. Thus, a technique in which a metal interconnection formed above the capacitor is used as a fuse has been proposed.

FIG. 2 is a cross-sectional view of a semiconductor device using a metal interconnection as a fuse.

Referring to FIG. 2, a substrate 20 has a cell region and a fuse region. The cell region of the substrate 20 is formed therein with cylindrical capacitors 24, each of which is stacked by a lower electrode 21, a dielectric layer 22, and an upper electrode 23. A first insulation layer 25 is formed over the whole surface of the resulting structure, which includes the cylindrical capacitors 24.

A metal interconnection 26 is formed above the first insulation layer 25. The metal interconnection 26 is used as a metal interconnection in the cell region, but as a fuse in the fuse region. A second insulation layer 27 is formed over the metal interconnection 26. Then, the second insulation layer 27 of the fuse region is subjected to selective repair-etching, so that it remains on the metal interconnection 26 at a predetermined thickness.

As described above, in the case in which the metal interconnection is used as the fuse, the etching is not performed by thicknesses of the capacitor 24 and the second insulation layer 27, compared to the case in which the capacitor is used as the fuse, so that the repair-etching becomes easier.

However, in the case in which the metal interconnection is used as the fuse, the layers stacked from the bottom to the top are formed in a multi-layered structure. Thus, when laser fuse cutting is subsequently performed, points between the respective layers, reacting with laser power, are different from each other, so that it is difficult to cut the fuse. Further, after the laser fuse cutting, cracks occur in the first insulation layer 25 under the fuse on either side of the fuse, and thus an electrical short occurs between the neighboring fuses.

In the typical fuse failure, it can be found that, after the laser fuse cutting, oxide cracks occur under the fuse, which is not cut, on either side of the fuse, and seem as if aluminum (Al) is melted down. For this reason, the short occurs between the neighboring fuses, and thus the operation of the cell becomes impossible.

SUMMARY OF THE INVENTION

Embodiments of the present invention are directed to providing a method for fabricating a semiconductor device, capable of preventing an electrical short between neighboring fuses when laser cutting is performed after repair-etching.

In accordance with an aspect of the present invention, a method for fabricating a semiconductor device includes forming a fuse over a substrate, the fuse having a barrier layer, a metal layer, and an anti-reflective layer stacked, selectively removing the anti-reflective layer, forming an insulation layer over a whole surface of the resultant structure including the fuse, and performing repair-etching such that part of the insulation layer remains above the fuse.

DESCRIPTION OF SPECIFIC EMBODIMENTS

FIGS. 3A to 3E are cross-sectional views of a method for fabricating a semiconductor device in accordance with an embodiment of the present invention.

Figure 1:
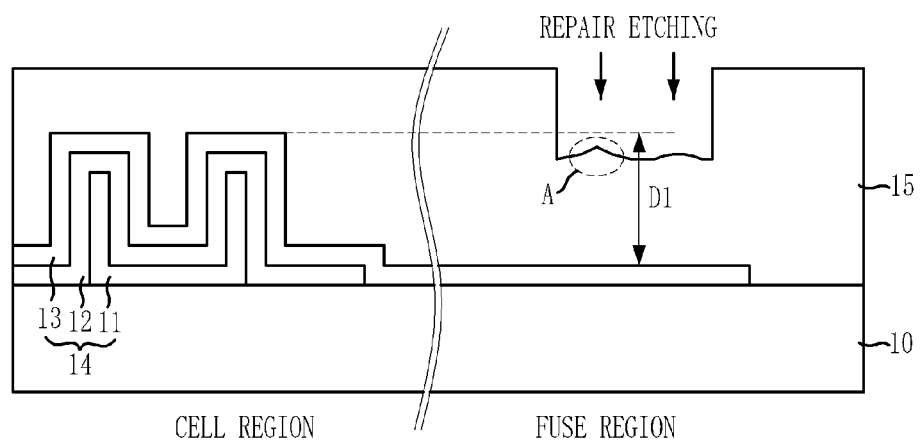
FIGS. 1 and 2 are cross-sectional views of a typical method for fabricating a semiconductor device.
Figure 2:
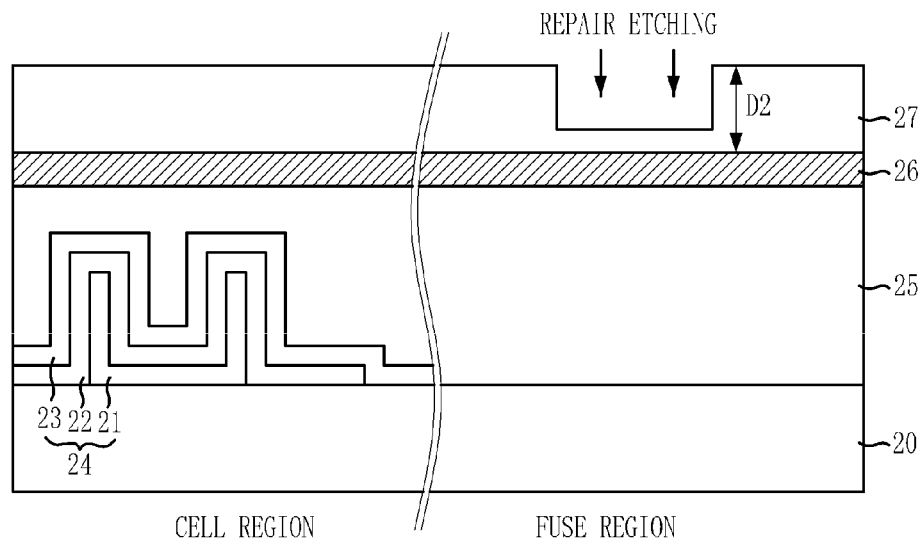
Figure 3A:
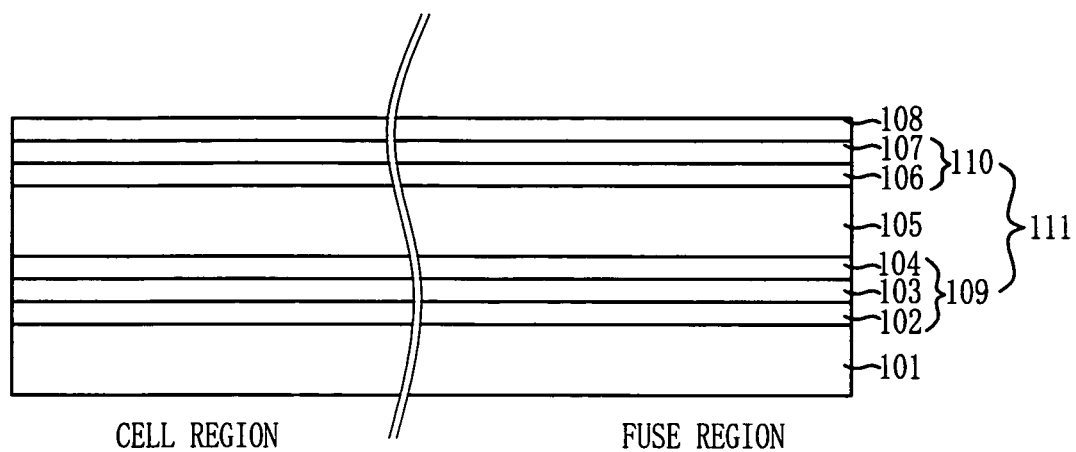
FIGS. 3A to 3E are cross-sectional views of a method for fabricating a semiconductor device in accordance with an embodiment of the present invention.

Referring to FIG. 3A, an interconnection layer 111 is formed over a substrate 101 having a cell region and a fuse region. Here, the substrate 101 may be a substrate on which a dynamic random access memory (DRAM) process is performed, or a substrate in which some processes of forming, for instance, a gate pattern, a bit line pattern, a capacitor, and an interlayer insulation layer are completed before the interconnection layer 111 is formed. Further, the interconnection layer 111 is formed in the cell and fuse regions at the same time, and is used as a metal interconnection in the cell region and as one fuse in the fuse region through a subsequent patterning process.

Particularly, the interconnection layer 111 is formed in a stacked structure in which a barrier layer 109, metal layers 105 and 105A, and an anti-reflective layer 110 are generally stacked. Here, the barrier layer 109 may have a stacked structure of a titanium nitride (TiN) layer 102, a titanium (Ti) layer 103, and a TiN layer 104, and the anti-reflective layer 110 may have a stacked structure of a Ti layer 106, a TiN layer 107, and a silicon oxynitride (SiON) layer 108. Meanwhile, the barrier layer 109 may have a single-layered structure of a Ti layer or a TiN layer, or a stacked structure of a Ti layer and a TiN layer, in addition to the stacked structure of the TiN layer 102, the Ti layer 103, and the TiN layer 104. Further, the anti-reflective layer 110 may have a single-layered structure of any one selected from a Ti layer, a TiN layer, and a SiON layer, in addition to the stacked structure of the Ti layer 106, the TiN layer 107, and the SiON layer 108.

Figure 3B:
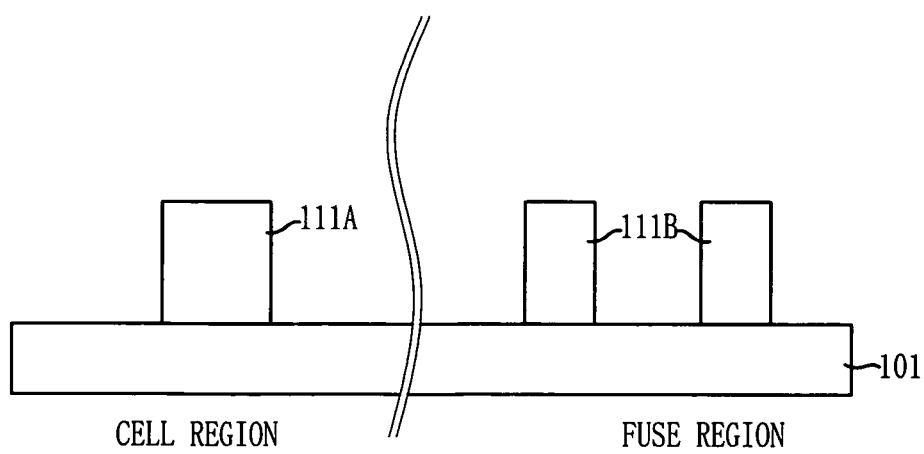

Referring to FIG. 3B, the interconnection layer 111 is patterned. Although not shown, the patterning can be performed by forming a photoresist pattern over the interconnection layer 111, patterning the photoresist pattern such that metal interconnection and fuse target regions are defined in the cell and fuse regions, respectively, by a photo-exposure and a development process, etching the interconnection layer 111 using the photoresist pattern as an etch mask, and removing the photoresist pattern.

Thus, the metal interconnection 111A is formed in the cell region, and the fuse 111B is formed in the fuse region.

Figure 3C:
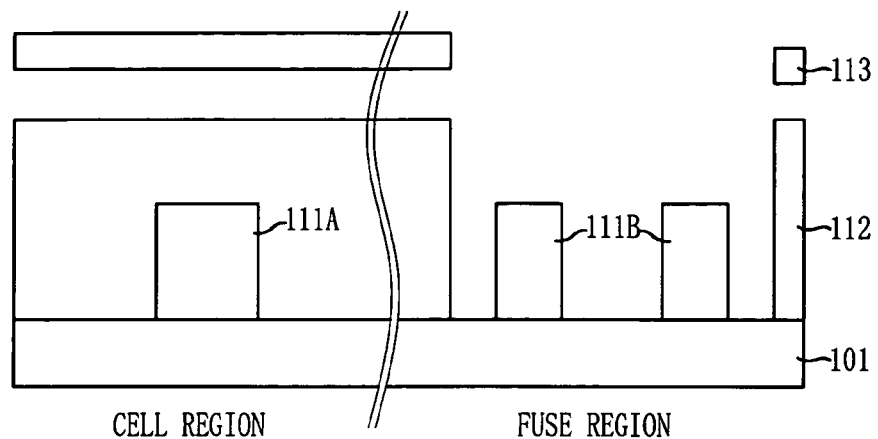

Referring to FIG. 3C, a mask pattern 112, which opens the fuse region, is formed. Here, the mask pattern 112 is formed by forming a mask layer on the whole surface of the resulting structure including the metal interconnection 111A and the fuse 111B, and patterning the mask layer so as to open only the fuse region. This is for removing a part (at least one layer) of the fuse 111B in advance in order to prevent any failure, which occurs due to the fuse 111B formed in multiple layers when the subsequent laser cutting is performed.

Figure 3D:
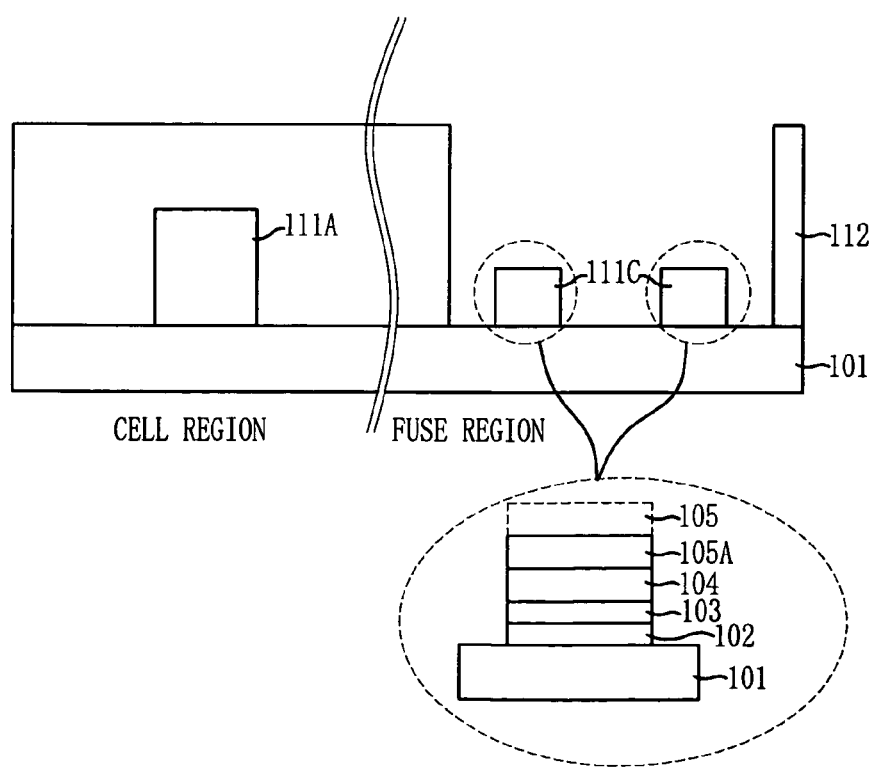

Referring to FIG. 3D, a part of the fuse 111B is etched. The part of the fuse is the anti-reflective layer 110. In addition to the anti-reflective layer 110, a part of the metal layer 105 can be further etched. Particularly, the metal layer can be etched at a thickness from approximately 500 Å to approximately 3,000 Å.

In the case in which the anti-reflective layer 110 has the stacked structure of the Ti layer 106, the TiN layer 107, and the SiON layer 108, and which the metal layer 105 is made of aluminum (Al), the anti-reflective layer 110, and the part of the metal layer 105 can be etched under conditions that a pressure from approximately 7 mT to approximately 20 mT, a top power from approximately 400 W to approximately 1,000 W, and a bottom power from approximately 50 W to approximately 200 W are applied using a gas mixture of chlorine ($Cl_2$), trichloroborane ($BCl_3$), argon (Ar), nitrogen ($N_2$) and fluoroform ($CHF_3$). At this time, the $Cl_2$ can be used in an amount from approximately 30 sccm to approximately 200 sccm, the $BCl_3$ from approximately 30 sccm to approximately 200 sccm, the Ar from approximately 30 sccm to approximately 150 sccm, the $N_2$ from approximately 1 sccm to approximately 20 sccm, and the $CHF_3$ from approximately 15 sccm to approximately 150 sccm.

More specifically, taking the recipe by way of example, the anti-reflective layer 110 can be etched under conditions that a pressure of approximately 12 mT, a top power of approximately 600 W, and a bottom power of approximately 100 W are applied using a mixture gas of the $Cl_2$ of approximately 50 sccm, the Ar of approximately 35 sccm, and the $CHF_3$ of approximately 15 sccm, and the part of the metal layer can be etched under conditions that a pressure of approximately 12 mT, a top power of approximately 600 W, and a bottom power of approximately 130 W are applied using a mixture gas of the $Cl_2$ of approximately 120 sccm, the $BCl_3$ of approximately 100 sccm, and the $N_2$ of approximately 5 sccm.

Hereinafter, the fuse 111B, the etching of which is completed, is referred to as a "fuse 111C," and the metal layer 105, the part of which is etched, is referred to as a "metal layer 105A."

Thus, at a point of time when the etching is completed, the fuse 111C remains in a stacked structure in which the barrier layer 109 consisting of the TiN layer 102, the Ti layer 103, and the TiN layer 104, and the partly etched metal layer 105A are stacked.

As described above, the anti-reflective layer 110 and the part of the metal layer 105 are removed in advance before the repair-etching, so that a margin can be improved when the subsequent laser cutting is performed. In other words, there can be overcome the known drawbacks that the cutting is difficult because the multi-layered structure of the fuse causes the difference in the laser power reacting on the respective materials when the subsequent laser cutting is performed, and that the oxide cracks occur under the fuse on either side of the fuse and thus an electrical short occurs between the neighboring fuses.

Figure 3E:
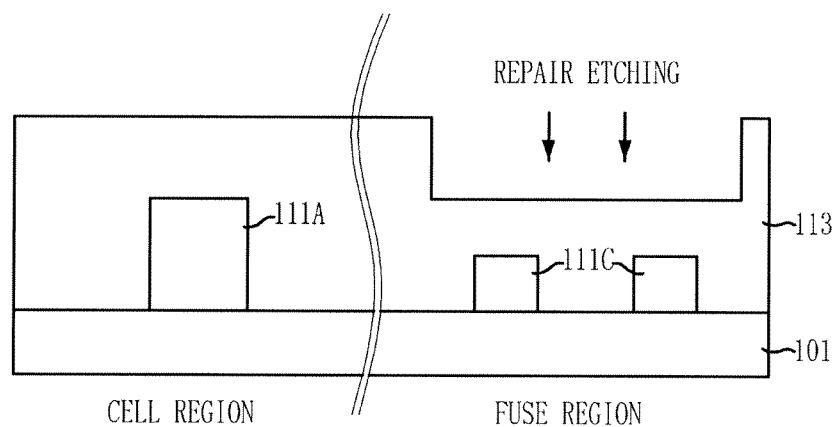

Referring to FIG. 3E, the mask pattern 112 is removed. Here, in the case in which the mask pattern 112 is a photoresist layer, it can be removed by an oxygen removal process.

Then, an insulation layer 113 is formed over the whole surface of the resultant structure, which includes the metal interconnection 111A and the fuse 111C. Here, the insulation layer 113 may include an oxide layer.

Subsequently, the insulation layer 113 of the fuse region is selectively etched, that is, is subjected to repair-etching such that part of the insulation layer 113 remains above the fuse 111C. At this time, the reason why the part of the insulation layer 113 remains above the fuse 111C when the repair-etching is performed is to prevent conductive chips, which are generated when the subsequent laser cutting is performed, from causing a short with an adjacent fuse.

In a fuse in accordance with an embodiment of the present invention, it can be found that the middle portion of the fuse has a height that is lower than that of an end of the fuse (where a transverse row portion is a boundary portion on which the mask patterning is performed).

In the present invention, after the fuse 11B is formed in the fuse region like the metal interconnection 111A of the cell region, the part of the fuse B of the fuse region is removed in advance, and then the following process is performed. Thereby, the present invention can overcome the drawback that the oxide cracks occur under the fuse and thus the electrical short occurs between the neighboring fuses because the multi-layered structure of the fuse causes the difference in the laser power reacting on the respective layers when the subsequent laser cutting is performed.

As described above, the present invention partly etches the upper layers of the fuse having a multi-layered structure, so that it can improve a laser cutting margin and thus a yield of the device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:

forming a substrate having a cell region and a fuse region;

forming a metal interconnection in the cell region and a fuse in the fuse region, the fuse having a barrier layer, a metal layer, and an anti-reflective layer stacked, wherein the metal interconnection has the same structure with the fuse and is concurrently formed with the fuse;

completely removing the anti-reflective layer and simultaneous etching a portion of the metal layer to expose an upper portion of the etched metal layer, thereby forming a resultant structure, wherein the anti-reflective layer and the portion of the metal layer are etched using a gas mixture of chlorine ($Cl_2$), trichloroborane ($BCl_3$), argon (Ar), nitrogen ($N_2$) and fluoroform ($CHF_3$);

forming an insulation layer over a whole surface of the resultant structure including the fuse; and performing a repair-etching such that part of the insulation layer remains above the fuse, wherein the anti-reflective layer includes any one of a single-layered structure of any one selected from a Ti layer, a TiN layer, and a silicon oxynitride (SiON) layer, and a stacked structure of the Ti layer, a TiN layer, and a SiON layer.

2. The method of claim 1, wherein the barrier layer is one selected from a single-layered structure of a titanium (Ti) layer or a titanium nitride (TiN) layer, a stacked structure of the Ti layer and the TiN layer, and a stacked structure of the Ti layer, the Ti layer, and the TiN layer.

3. The method of claim 1, wherein the metal layer includes aluminum (Al).

4. The method of claim 1, wherein the gas of $Cl_2$ is used in an amount from approximately 30 sccm to approximately 200 sccm, the gas of $BCl_3$ is used in an amount from approximately 30 sccm to approximately 200 sccm, the gas of Ar is used in an amount from approximately 30 sccm to approximately 150 sccm, the gas of $N_2$ is used in an amount from approximately 1 sccm to approximately 20 sccm, and the gas of $CHF_3$ is used in an amount from approximately 15 sccm to approximately 150 sccm.

5. The method of claim 1, wherein the anti-reflective layer and the portion of the metal layer are etched by applying a pressure from approximately 7 mT to approximately 20 mT, a top power from approximately 400 W to approximately 1,000 W, and a bottom power from approximately 50 W to approximately 200 W.

6. The method of claim 1, wherein the portion of the metal layer is etched at a thickness from approximately 500 Å to approximately 3,000 Å.

7. The method of claim 1, wherein the insulation layer includes an oxide layer.

* * * * *